(12) United States Patent
Li

(10) Patent No.: US 12,288,774 B2
(45) Date of Patent: Apr. 29, 2025

(54) MICRO LIGHT EMITTING DIODE STRUCTURE AND MICRO LIGHT EMITTING DIODE DEVICE

(71) Applicant: PlayNitride Display Co., Ltd., MiaoLi County (TW)

(72) Inventor: Yun-Li Li, MiaoLi County (TW)

(73) Assignee: PlayNitride Display Co., Ltd., MiaoLi County (TW)

( * ) Notice: Subject to any disclaimer, the term of this patent is extended or adjusted under 35 U.S.C. 154(b) by 12 days.

(21) Appl. No.: 18/479,126

(22) Filed: Oct. 2, 2023

(65) Prior Publication Data

US 2024/0030196 A1    Jan. 25, 2024

Related U.S. Application Data

(62) Division of application No. 17/084,592, filed on Oct. 29, 2020, now Pat. No. 11,810,904.

(60) Provisional application No. 62/980,441, filed on Feb. 24, 2020.

(30) Foreign Application Priority Data

May 18, 2020  (TW) ................. 109116346

(51) Int. Cl.
  *H01L 29/205*   (2006.01)
  *H01L 25/075*   (2006.01)
  *H01L 25/16*    (2023.01)
  *H01L 33/00*    (2010.01)
  *H10H 20/856*   (2025.01)

(52) U.S. Cl.
  CPC ........ *H01L 25/0753* (2013.01); *H01L 25/167* (2013.01); *H10H 20/856* (2025.01)

(58) Field of Classification Search
  CPC ....... H01L 25/167; H01L 33/60; H01L 33/62; H01L 21/6835
  See application file for complete search history.

(56) References Cited

U.S. PATENT DOCUMENTS

| 2012/0154898 | A1* | 6/2012 | Kwon | G02F 1/16761 |
| | | | | 359/296 |
| 2019/0237452 | A1* | 8/2019 | Kuo | H01L 33/502 |
| 2019/0295996 | A1* | 9/2019 | Park | H01L 33/502 |
| 2020/0096812 | A1* | 3/2020 | Hinata | G02F 1/133528 |
| 2020/0103715 | A1* | 4/2020 | Yang | G02F 1/136209 |

(Continued)

*Primary Examiner* — Ismail A Muse
(74) *Attorney, Agent, or Firm* — JCIPRNET

(57) ABSTRACT

A micro light emitting diode structure includes a temporary substrate, a plurality of micro light emitting elements, a plurality of light blocking structures, and a connection layer. The micro light emitting elements and the light blocking structures are disposed on the temporary substrate and arranged alternately. Each of the light blocking structures includes a light blocking layer, and a light shielding layer disposed thereon. The micro light emitting elements and the light blocking structures are fixed to the temporary substrate by the connection layer. The connection layer is a part of a plurality of fixing structures. A reflectivity of the light blocking layer is greater than a reflectivity of the connection layer, and a Young's modulus of the light blocking layer is greater than a Young's modulus of the fixing structures, and the Young's modulus of the fixing structures is greater than a Young's modulus of the light shielding layer.

14 Claims, 9 Drawing Sheets

(56) References Cited

U.S. PATENT DOCUMENTS

2021/0101840 A1\* 4/2021 Kimura ................... C23C 24/04
2022/0010144 A1\* 1/2022 Hotter .................... C09D 5/035

\* cited by examiner

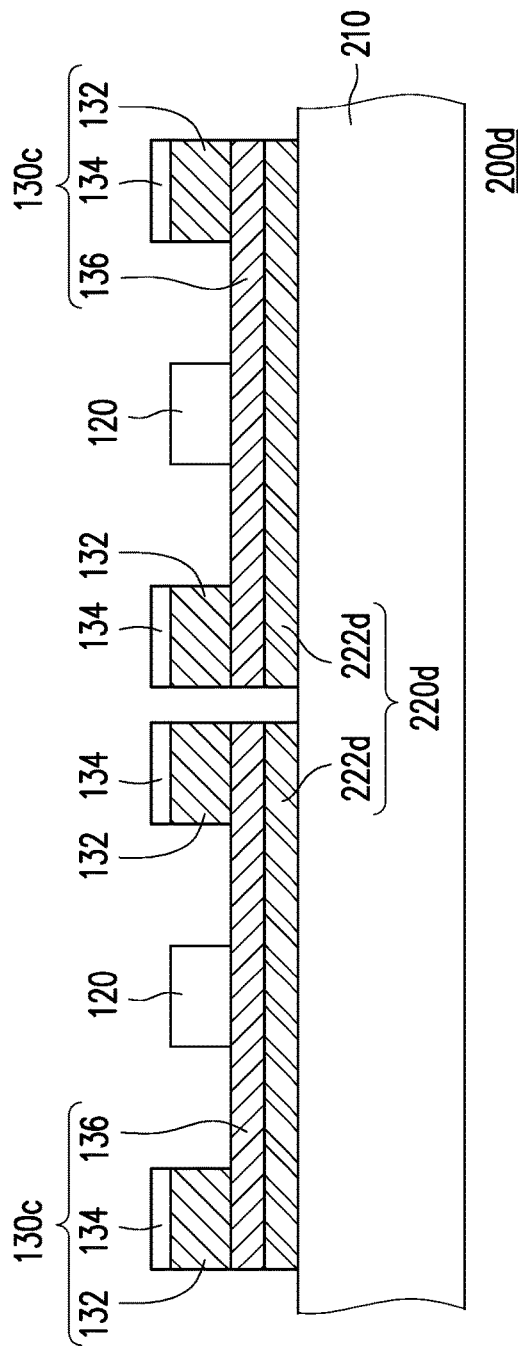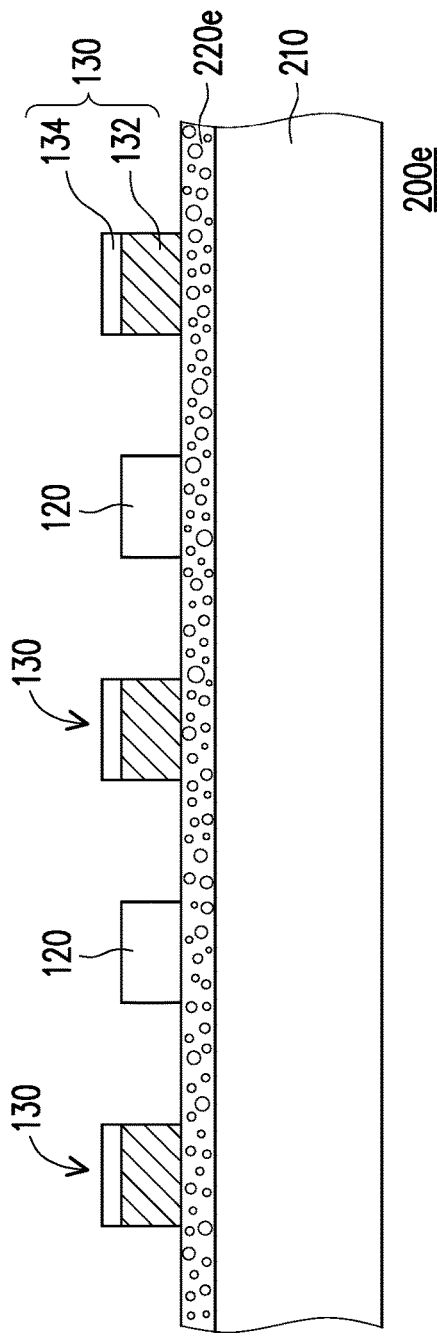

MICRO LIGHT EMITTING DIODE STRUCTURE AND MICRO LIGHT EMITTING DIODE DEVICE

CROSS-REFERENCE TO RELATED APPLICATION

This application is a divisional application of and claims the priority benefit of a prior application Ser. No. 17/084,592, filed on Oct. 29, 2020, now allowed, which claims the priority benefit of U.S. provisional application Ser. No. 62/980,441, filed on Feb. 24, 2020, and Taiwan application no. 109116346, filed on May 18, 2020. The entirety of each of the above-mentioned patent applications is hereby incorporated by reference herein and made a part of this specification.

BACKGROUND

Technical Field

The disclosure relates to a light emitting structure, a manufacturing method thereof, and a device, and in particular relates to a micro light emitting diode structure, a manufacturing method thereof, and a micro light emitting diode device.

Description of Related Art

When manufacturing the conventional micro light emitting diode structure, generally the light blocking structure is manufactured after the micro light emitting diode is transferred onto the temporary substrate. As the fabrication of the light blocking structure involves lithography processes such as exposure, development, and etching, the micro light emitting diode that has been transferred onto the temporary substrate may be damaged easily. Besides, when the light blocking structure is manufactured on the temporary substrate, the efficiency of development and peeling may also be poor, which reduces the structural reliability and results in low yield.

SUMMARY

The disclosure provides a micro light emitting diode structure which has good structural reliability.

The disclosure provides a manufacturing method for manufacturing the above-described micro light emitting diode structure with good production yield.

The disclosure also provides a micro light emitting diode device which includes the above-described micro light emitting diode structure and has good display yield.

A micro light emitting diode structure of the disclosure includes: a temporary substrate; a plurality of micro light emitting elements disposed on the temporary substrate; a plurality of light blocking structures disposed on the temporary substrate and arranged alternately with the micro light emitting elements, wherein each of the light blocking structures includes a light blocking layer and a light shielding layer disposed on the light blocking layer; and a connection layer. The micro light emitting elements and the light blocking structures are fixed to the temporary substrate by the connection layer. A reflectivity of the light blocking layer is greater than a reflectivity of the connection layer, and a Young's modulus of the light blocking layer is greater than a Young's modulus of the connection layer.

In an embodiment of the disclosure, the reflectivity of the light blocking layer is greater than a reflectivity of the light shielding layer, and the Young's modulus of the light blocking layer is greater than a Young's modulus of the light shielding layer.

In an embodiment of the disclosure, the Young's modulus of the light shielding layer is greater than or equal to the Young's modulus of the connection layer.

In an embodiment of the disclosure, the connection layer includes a plurality of connection parts separated from each other. The micro light emitting elements and the light blocking layer of each of the light blocking structures are respectively disposed on the connection parts, and the connection parts expose a part of the temporary substrate.

In an embodiment of the disclosure, the connection layer is a part of a plurality of fixing structures. The Young's modulus of the light blocking layer is greater than a Young's modulus of the fixing structures, and the Young's modulus of the fixing structures is greater than a Young's modulus of the light shielding layer.

In an embodiment of the disclosure, the fixing structures include a plurality of first fixing structures and a plurality of second fixing structures. Each of the first fixing structures covers the light shielding layer and extends from an edge of the light shielding layer to cover an edge of the light blocking layer and is connected to the temporary substrate. A first air gap is provided between the light blocking layer and the temporary substrate. Each of the second fixing structures covers the respective micro light emitting element and extends from an edge of the respective micro light emitting element and is connected to the temporary substrate. A second air gap is provided between the respective micro light emitting element and the temporary substrate.

In an embodiment of the disclosure, an edge of the light shielding layer is aligned with an edge of the light blocking layer.

In an embodiment of the disclosure, a width of the light blocking layer gradually increases in a direction from the light shielding layer toward the temporary substrate, and a width of each of the micro light emitting elements gradually increases from the temporary substrate toward a direction away from the temporary substrate.

In an embodiment of the disclosure, a first height of each of the light blocking structures is greater than or equal to a second height of each of the micro light emitting elements.

In an embodiment of the disclosure, a third height of the light blocking layer is greater than or equal to the second height of each of the micro light emitting elements.

In an embodiment of the disclosure, the light blocking structures further include a plurality of light blocking connection layers, and each of the light blocking connection layers connects each of the micro light emitting elements and the light blocking layers located on two opposite sides of each of the micro light emitting elements.

In an embodiment of the disclosure, the light blocking layer has a rough peripheral surface.

A micro light emitting diode device of the disclosure includes: a circuit substrate; a plurality of micro light emitting elements disposed on the circuit substrate; a plurality of light blocking structures disposed on the circuit substrate and arranged alternately with the micro light emitting elements, wherein each of the light blocking structures includes a light blocking layer and a light shielding layer disposed on the light blocking layer; and a connection layer. The light blocking structures are fixed to the circuit substrate by the connection layer. A reflectivity of the light blocking layer is greater than a reflectivity of the connection layer, and a Young's modulus of the light blocking layer is greater than a Young's modulus of the connection layer.

In an embodiment of the disclosure, the reflectivity of the light blocking layer is greater than a reflectivity of the light shielding layer, and the Young's modulus of the light blocking layer is greater than a Young's modulus of the light shielding layer.

In an embodiment of the disclosure, the micro light emitting diode device further includes: a plurality of light guide layers at least disposed on the light shielding layer. An edge of each of the light guide layers is aligned with or smaller than an edge of the corresponding light shielding layer.

In an embodiment of the disclosure, the connection layer includes a plurality of connection parts. The connection parts are respectively located between the light blocking structures and the circuit substrate, and the Young's modulus of the light blocking layer is greater than a Young's modulus of the connection part.

In an embodiment of the disclosure, an orthographic projection area of each of the connection parts on the circuit substrate is greater than an orthographic projection area of each of the light blocking structures on the circuit substrate.

In an embodiment of the disclosure, the connection layer includes a plurality of pad parts, and the light blocking structures further include a plurality of light blocking connection layers. Each of the light blocking connection layers connects each of the micro light emitting elements and the light blocking layers located on two opposite sides of each of the micro light emitting elements. Each of the pad parts is located between the light blocking connection layer and the circuit substrate, and the micro light emitting elements are electrically connected to the circuit substrate through the pad parts.

In an embodiment of the disclosure, the connection layer is an anisotropic conductive film (ACF) layer.

In an embodiment of the disclosure, each of the light blocking structures is inclined at an angle with respect to an extending direction of the circuit substrate, and maximum distances from each of the micro light emitting elements to the light blocking structures located on two opposite sides are different.

In an embodiment of the disclosure, the micro light emitting diode device further includes: a light conversion layer connecting the light blocking structures and covering the micro light emitting elements. A gap is provided between the light conversion layer and the circuit substrate.

A manufacturing method of a micro light emitting diode structure according to the disclosure includes: providing a first transfer stamp carrying a plurality of micro light emitting elements separated from each other; providing a second transfer stamp carrying a plurality of light blocking structures separated from each other, wherein each of the light blocking structures includes a light blocking layer and a light shielding layer disposed on the light blocking layer; providing a temporary substrate; transferring the micro light emitting elements onto the temporary substrate by the first transfer stamp; and transferring the light blocking structures onto the temporary substrate by the second transfer stamp. The micro light emitting elements and the light blocking structures are arranged alternately and fixed to the temporary substrate by a connection layer. A reflectivity of the light blocking layer is greater than a reflectivity of the connection layer, and a Young's modulus of the light blocking layer is greater than a Young's modulus of the connection layer.

In an embodiment of the disclosure, the step of carrying the light blocking structures on the second transfer stamp includes: forming a light blocking material layer; forming a light shielding material layer on the light blocking material layer; performing a singulation process on the light blocking material layer and the light shielding material layer to form the light blocking structures; and arranging the light blocking structures in a matrix on the second transfer stamp.

In an embodiment of the disclosure, the singulation process includes an etching method or a splitting method.

In an embodiment of the disclosure, the micro light emitting elements are transferred onto the temporary substrate by the first transfer stamp after the light blocking structures are transferred onto the temporary substrate by the second transfer stamp.

In an embodiment of the disclosure, the light blocking structures further include a plurality of light blocking connection layers, and each of the light blocking connection layers connects each of the micro light emitting elements and the light blocking layers located on two opposite sides of each of the micro light emitting elements.

In an embodiment of the disclosure, the connection layer is a part of a plurality of fixing structures. The fixing structures include a plurality of first fixing structures and a plurality of second fixing structures. Each of the first fixing structures covers the light shielding layer and extends from an edge of the light shielding layer to cover an edge of the light blocking layer and is connected to the temporary substrate. A first air gap is provided between the light blocking layer and the temporary substrate. Each of the second fixing structures covers the respective micro light emitting element and extends from an edge of the respective micro light emitting element and is connected to the temporary substrate. A second air gap is provided between the respective micro light emitting element and the temporary substrate.

In an embodiment of the disclosure, the light blocking structures are transferred onto the temporary substrate by the second transfer stamp after the micro light emitting elements are transferred onto the temporary substrate by the first transfer stamp, and a first height of each of the light blocking structures is greater than or equal to a second height of each of the micro light emitting elements.

Based on the above, in the manufacturing process of the micro light emitting diode structure of the disclosure, the fabricated light blocking structures and the micro light emitting elements are respectively transferred onto the temporary substrate, so as to obtain good process yield. As a result, the manufactured micro light emitting diode structure also has good structural reliability. In addition, with use of the micro light emitting diode structure of the disclosure, good display yield is achieved.

In order to make the above-mentioned features and advantages of the disclosure more understandable, exemplary embodiments are described in detail hereinafter with reference to the accompanying drawings.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

FIG. 3A to FIG. 3H are schematic partial cross-sectional views showing various micro light emitting diode devices according to embodiments of the disclosure.

DETAILED DESCRIPTION OF DISCLOSED EMBODIMENTS

Figure 1A:
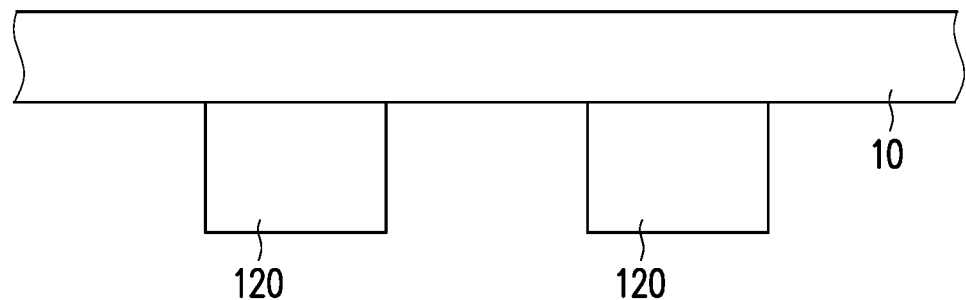
FIG. 1A to FIG. 1G are schematic views showing a manufacturing method of a micro light emitting diode structure according to an embodiment of the disclosure.
Figures 1B, 1C:
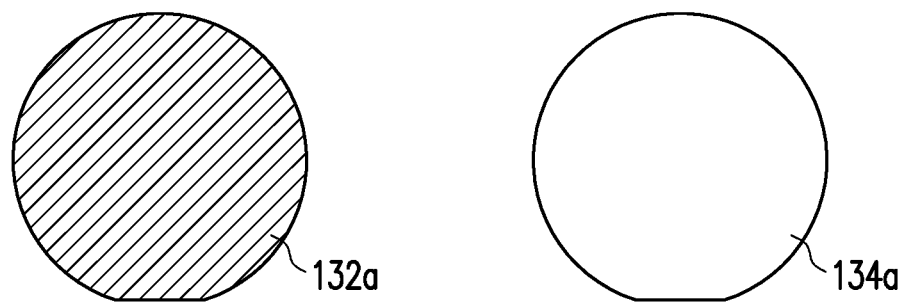
Figure 1D:
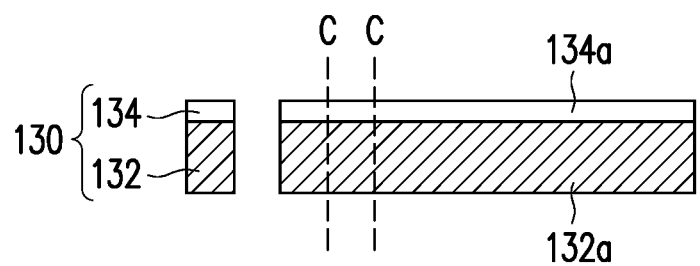
Figure 1E:
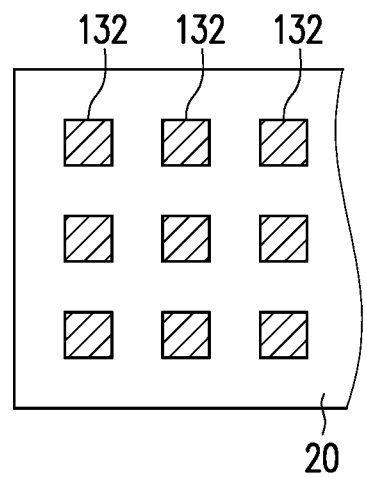

FIG. 1A to FIG. 1G are schematic views showing a manufacturing method of a micro light emitting diode structure according to an embodiment of the disclosure. To facilitate the description, FIG. 1B, FIG. 1C, and FIG. 1E are top views, and FIG. 1A, FIG. 1D, FIG. 1F, and FIG. 1G are partial cross-sectional views.

First, referring to FIG. 1A, in the manufacturing method of the micro light emitting diode structure according to the present embodiment, firstly, a first transfer stamp 10 is provided. The first transfer stamp 10 carries thereon a plurality of micro light emitting elements 120 separated from each other. Preferably, the micro light emitting elements 120 may be arranged in a matrix on the first transfer stamp 10, but the disclosure is not limited thereto. Herein, the micro light emitting element 120 is, for example, a micro light emitting diode (Micro LED). A maximum size of the micro light emitting element 120 is smaller than or equal to 100 microns, and the thickness of the micro light emitting element 120 is smaller than or equal to 15 microns, so as to subsequently transfer, integrate, and assemble the micro light emitting element 120 to a heterogeneous integrated system, including substrates of various sizes such as a micro display and a large-area display. Nevertheless, the disclosure is not limited thereto.

Figure 1F:
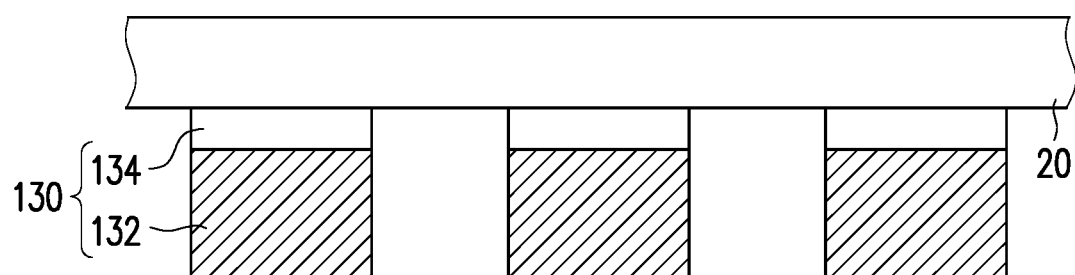

Next, referring to FIG. 1F, a second transfer stamp 20 is provided. The second transfer stamp 20 carries thereon a plurality of light blocking structures 130 separated from each other. Each light blocking structure 130 includes a light blocking layer 132 and a light shielding layer 134 disposed on the light blocking layer 132. Specifically, regarding the step of disposing the light blocking structure 130 on the second transfer stamp 20, first, referring to FIG. 1B, a light blocking material layer 132a is formed. Herein, the light blocking material layer 132a is a reflective material and has a reflectivity greater than 80%, for example. The light blocking material layer 132a is, for example, a ceramic material, a metal material, or a colloid containing metal particles, but the disclosure is not limited thereto. The light blocking material layer 132a may also be a light absorbing material and has a light absorption rate greater than 80%, for example, but the disclosure is not limited thereto. Next, referring to FIG. 1C, a light shielding material layer 134a is formed on the light blocking material layer 132a. A material of the light shielding material layer 134a is a light absorbing material and has a light absorption rate greater than 80%, for example. The light shielding material layer 134a is, for example, a dark-colored light absorbing structure, including a resin-based black structure, a metal black structure, a graphite black structure, carbon black, a nitride combination, or an oxide combination, which blocks light that is not blocked by the light blocking material layer 132a so as to prevent the adjacent micro light emitting elements 120 (referring to FIG. 1G) from affecting each other and generating cross talk. Herein, the step of forming the light shielding material layer 134a is, for example, performed by a coating method or a printing method, but the disclosure is not limited thereto. Then, referring to FIG. 1D, a singulation process is performed on the light blocking material layer 132a and the light shielding material layer 134a to form the plurality of light blocking structures 130 along a cutting line C. Here, the singulation process includes an etching method or a splitting method. The thickness of the light shielding layer 134 is greater than the thickness of the light blocking layer 132. Thereafter, referring to FIG. 1F, the light blocking structures 130 are arranged in a matrix on the second transfer stamp 20. The light shielding layer 134 is located between the second transfer stamp 20 and the light blocking layer 132.

Figure 1G:
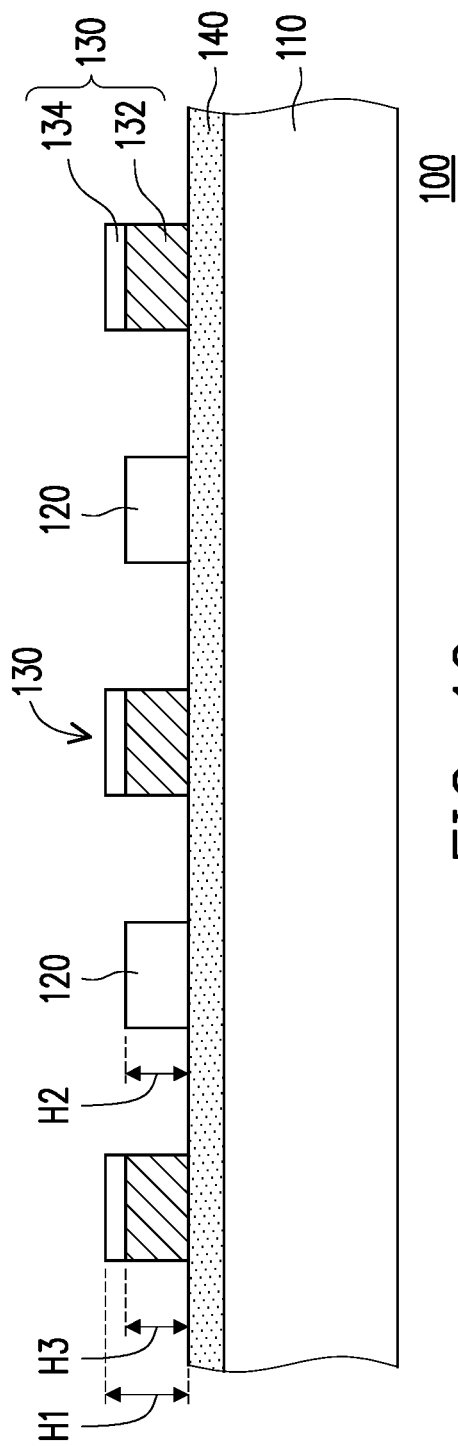

Finally, referring to FIG. 1A, FIG. 1F, and FIG. 1G, a temporary substrate 110 is provided. The temporary substrate 110 is, for example, a non-circuit substrate such as a plastic substrate, a glass substrate, or a sapphire substrate, but the disclosure is not limited thereto. The plurality of micro light emitting elements 120 are transferred onto the temporary substrate 110 by the first transfer stamp 10. The plurality of light blocking structures 130 are transferred onto the temporary substrate 110 by the second transfer stamp 20. In the present embodiment, the micro light emitting elements 120 and the light blocking structures 130 are respectively mass-transferred onto the temporary substrate 110 by two times of mass transfer. Nevertheless, the disclosure is not intended to limit the order in which the micro light emitting elements 120 and the light blocking structures 130 are mass-transferred onto the temporary substrate 110. As shown in FIG. 1G, the micro light emitting elements 120 and the light blocking structures 130 are arranged alternately and fixed to the temporary substrate 110 by a connection layer 140. Herein, the reflectivity of the light blocking layer 132 is greater than the reflectivity of the connection layer 140, and the Young's modulus of the light blocking layer 132 is greater than the Young's modulus of the connection layer 140.

More specifically, the connection layer 140 of the present embodiment is embodied as an organic material, and the micro light emitting element 120 and the light blocking layer 132 of the light blocking structure 130 may be fixed to the temporary substrate 110 by the connection layer 140. Herein, the connection layer 140 is an entire layer and continuously covers the temporary substrate 110. In particular, a first height H1 of each light blocking structure 130 is greater than or equal to a second height H2 of each micro light emitting element 120. Preferably, the first height H1 of each light blocking structure 130 is greater than the second height H2 of each micro light emitting element 120, and the ratio of H2/H1 is between 0.5 and 1. If the above ratio is too small, light is blocked, which causes obvious streaks during display. Furthermore, a third height H3 of each light blocking layer 132 is greater than or equal to the second height H2 of each micro light emitting element 120, and the ratio of H2/H3 is between 0.8 and 1. If the above ratio is too small, light is blocked, which causes obvious streaks during display. With the design of different heights, the light blocking structure 130 effectively reflects the lateral light of the micro light emitting element 120 to the front surface without blocking the light. Since the first height H1 of the light blocking structure 130 is greater than the second height H2 of the micro light emitting element 120, preferably, the light blocking structures 130 may be transferred to the top of the temporary substrate 110 by the second transfer stamp 20 before the micro light emitting elements 120 are transferred onto the temporary substrate 110 by the first transfer stamp 10. That is to say, the micro light emitting elements 120 are mass-transferred onto the temporary substrate 110 after the light blocking structures 130 are mass-transferred onto the temporary substrate 110, so as to obtain good process yield.

In terms of structure, referring to FIG. 1G, the micro light emitting diode structure 100 includes the temporary substrate 110, the plurality of micro light emitting elements 120, the plurality of light blocking structures 130, and the connection layer 140. The micro light emitting elements 120 are disposed on the temporary substrate 110. The light blocking structures 130 are disposed on the temporary substrate 110 and arranged alternately with the micro light emitting elements 120. Each light blocking structure 130 includes the light blocking layer 132 and the light shielding layer 134 disposed on the light blocking layer 132. An edge of the light shielding layer 134 is aligned with an edge of the light blocking layer 132. The micro light emitting elements 120 and the light blocking structures 130 are fixed to the temporary substrate 110 by the connection layer 140. The reflectivity of the light blocking layer 132 is greater than the reflectivity of the connection layer 140, and the reflectivity of the light blocking layer 132 is greater than the reflectivity of the light shielding layer 134, so that the light blocking layers 132 on two sides of the micro light emitting element 120 effectively reflect the lateral light of the micro light emitting element 120. Herein, the connection layer 140 is an entire layer and a continuous adhesive layer. Preferably, the Young's modulus of the light blocking layer 132 is greater than the Young's modulus of the micro light emitting element 120, the Young's modulus of the micro light emitting element 120 is greater than the Young's modulus of the light shielding layer 134, and the Young's modulus of the light shielding layer 134 is greater than or equal to the Young's modulus of the connection layer 140. As the connection layer 140 has the smallest Young's modulus, the connection layer 140 may serve as a buffer during the mass transfer of the micro light emitting elements 120 and the light blocking structures 130.

It is noted here that the following embodiments will be described with reference to the reference numerals and part of the contents of the foregoing embodiments, wherein the same reference numerals are used to indicate the same or similar elements, and the description of the same technical contents is omitted. Please refer to the foregoing embodiments for the description of the omitted contents, which will not be repeated hereinafter.

Figure 2A:
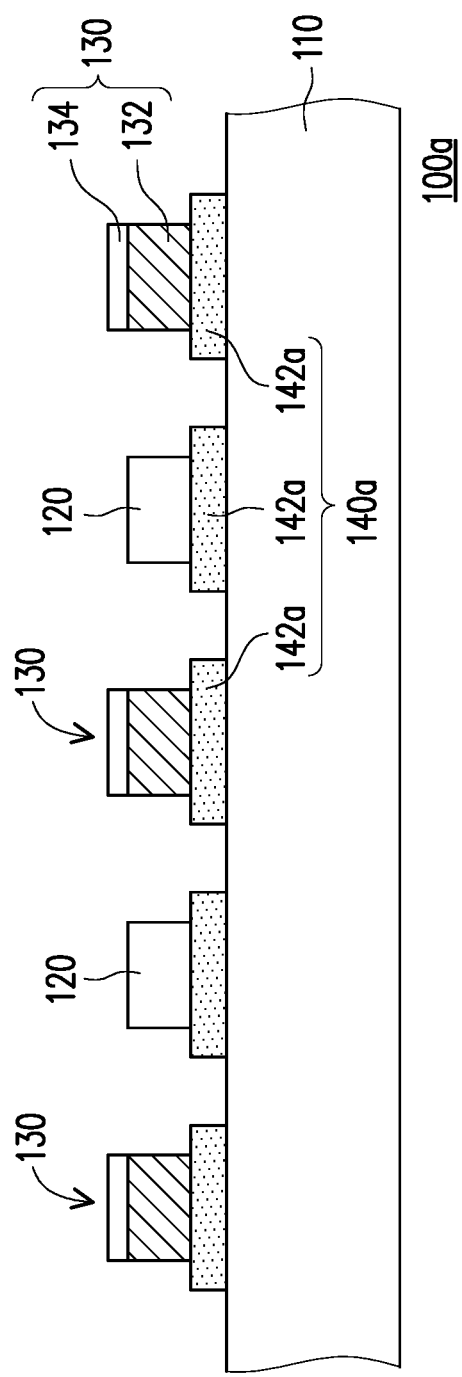
FIG. 2A to FIG. 2D are schematic partial cross-sectional views showing various micro light emitting diode structures according to embodiments of the disclosure.

FIG. 2A is a schematic partial cross-sectional view of a micro light emitting diode structure according to an embodiment of the disclosure. Referring to FIG. 1G and FIG. 2A, the micro light emitting diode structure 100a of the present embodiment is similar to the micro light emitting diode structure 100 of FIG. 1G, and the difference between the two structures is that: the connection layer 140a of the present embodiment is embodied as including a plurality of connection parts 142a separated from each other. The micro light emitting element 120 and the light blocking layer 132 of each light blocking structure 130 are respectively disposed on the connection part 142a. The connection parts 142a expose a part of the temporary substrate 110. Herein, an orthographic projection area of the connection part 142a on the temporary substrate 110 is greater than an orthographic projection area of the micro light emitting element 120 on the temporary substrate 110 and an orthographic projection area of the light blocking structure 130 on the temporary substrate 110, so as to increase the yield of transfer.

Figure 2B:
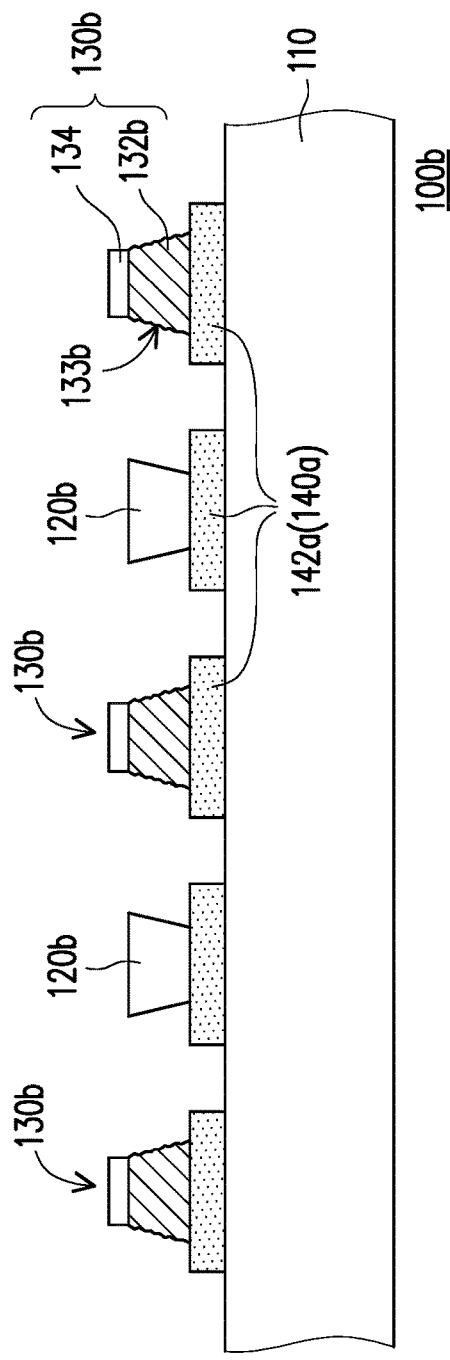

FIG. 2B is a schematic partial cross-sectional view of a micro light emitting diode structure according to an embodiment of the disclosure. Referring to FIG. 2A and FIG. 2B, the micro light emitting diode structure 100b of the present embodiment is similar to the micro light emitting diode structure 100a of FIG. 2A, and the difference between the two structures is that: the light blocking layer 132b of the light blocking structure 130b of the present embodiment has a rough peripheral surface 133b. The rough peripheral surface 133b is, for example, formed by a singulation process using a splitting method, so as to increase reflection. Herein, the width of the light blocking layer 132b gradually increases in the direction from the light shielding layer 134 toward the temporary substrate 110, and the width of each micro light emitting element 120b gradually increases from the temporary substrate 110 toward the direction away from the temporary substrate 110. In other words, the cross-sectional shape of the light blocking layer 132b is a positive trapezoid, and the cross-sectional shape of the micro light emitting element 120b is an inverted trapezoid, so as to concentrate light.

Figure 2C:
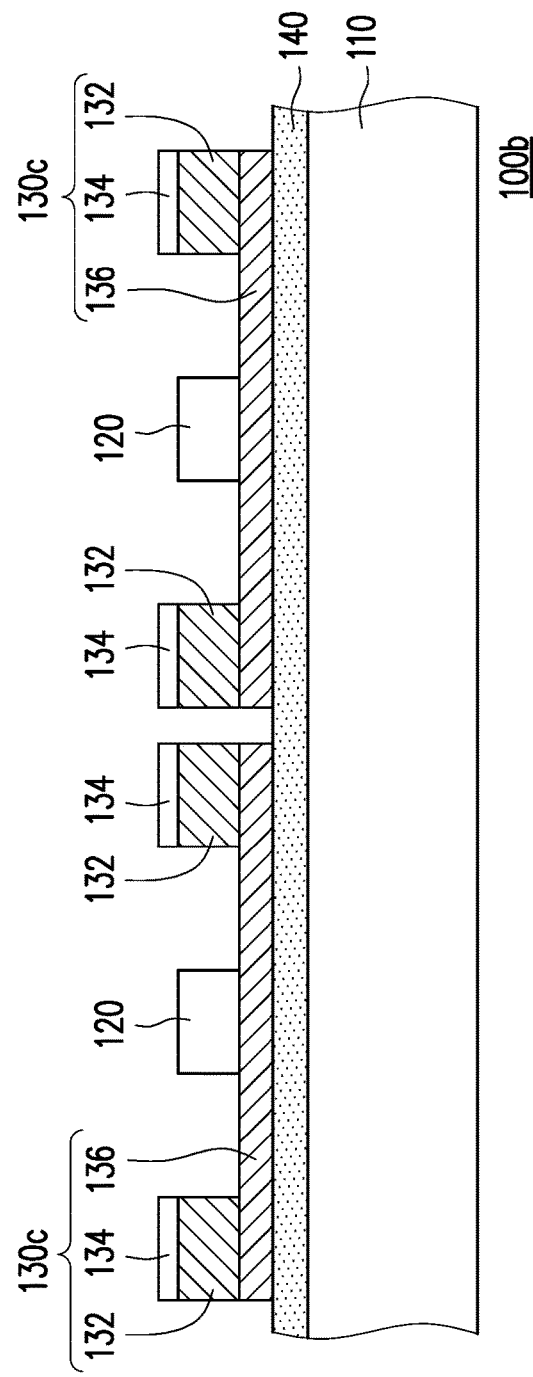

FIG. 2C is a schematic partial cross-sectional view of a micro light emitting diode structure according to an embodiment of the disclosure. Referring to FIG. 1G and FIG. 2C, the micro light emitting diode structure 100c of the present embodiment is similar to the micro light emitting diode structure 100 of FIG. 1G, and the difference between the two structures is that: the light blocking structure 130c of the present embodiment further includes a plurality of light blocking connection layers 136. Each light blocking connection layer 136 connects each micro light emitting element 120 and the light blocking layer 132 on two opposite sides of the micro light emitting element 120. In other words, the light blocking connection layer 136 is located under the micro light emitting element 120. Therefore, the micro light emitting elements 120 are mass-transferred onto the temporary substrate 110 after the light blocking structures 130c are mass-transferred onto the temporary substrate 110. That is, the light blocking structures 130 are transferred onto the temporary substrate 110 by the second transfer stamp 20 after the micro light emitting elements 120 are transferred onto the temporary substrate 110 by the first transfer stamp 10. Herein, the light blocking connection layer 136 may be integrally formed with the light blocking layer 132. That is, the light blocking connection layer 136 and the light blocking layer 132 have the same material, but the disclosure is not limited thereto.

Figure 2D:
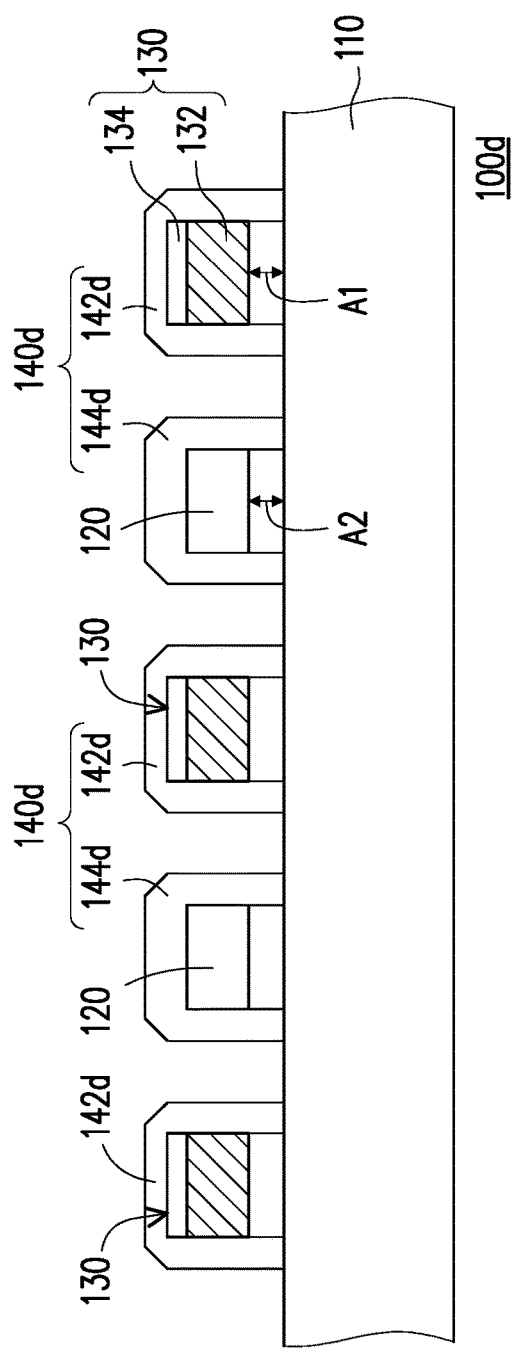

FIG. 2D is a schematic partial cross-sectional view of a micro light emitting diode structure according to an embodiment of the disclosure. Referring to FIG. 1G and FIG. 2D, the micro light emitting diode structure 100d of the present embodiment is similar to the micro light emitting diode structure 100 of FIG. 1G, and the difference between the two structures is that: the connection layer of the present embodiment is embodied as a part of a plurality of fixing structures 140d. Specifically, the fixing structures 140d include a plurality of first fixing structures 142d and a plurality of second fixing structures 144d. Each first fixing structure 142d covers the light shielding layer 134, and extends from an edge of the light shielding layer 134 to cover an edge of the light blocking layer 132 and is connected to the temporary substrate 110. A first air gap A1 is provided between the light blocking layer 132 and the temporary substrate 110. Each second fixing structure 144d covers the micro light emitting element 120, and extends from an edge of the micro light emitting element 120 and is connected to the temporary substrate 110. A second air gap A2 is provided between the micro light emitting element 120 and the temporary substrate 110. In other words, the light blocking structure 130 and the micro light emitting element 120 do not directly contact the temporary substrate 110, but indirectly contact the temporary substrate 110 through a part of the first fixing structure 142d and a part of the second fixing structure 144d.

Preferably, the Young's modulus of the light blocking layer 132 is greater than the Young's modulus of the fixing structure 140d, and the Young's modulus of the fixing structure 140d is greater than the Young's modulus of the light shielding layer 134, so as to provide good protection for the fixing structure 140d. Herein, the material of the fixing structure 140d is, for example, silicon dioxide, silicon nitride, silicon oxide glass (SOG), or other suitable inorganic materials, or may be a conductive material, so that the fixing structure 140d remaining on the surface of the micro light emitting element 120 after the subsequent transfer may serve as an electrode of a vertical micro element or as a common electrode. Nevertheless, the disclosure is not limited thereto.

Figure 3A:
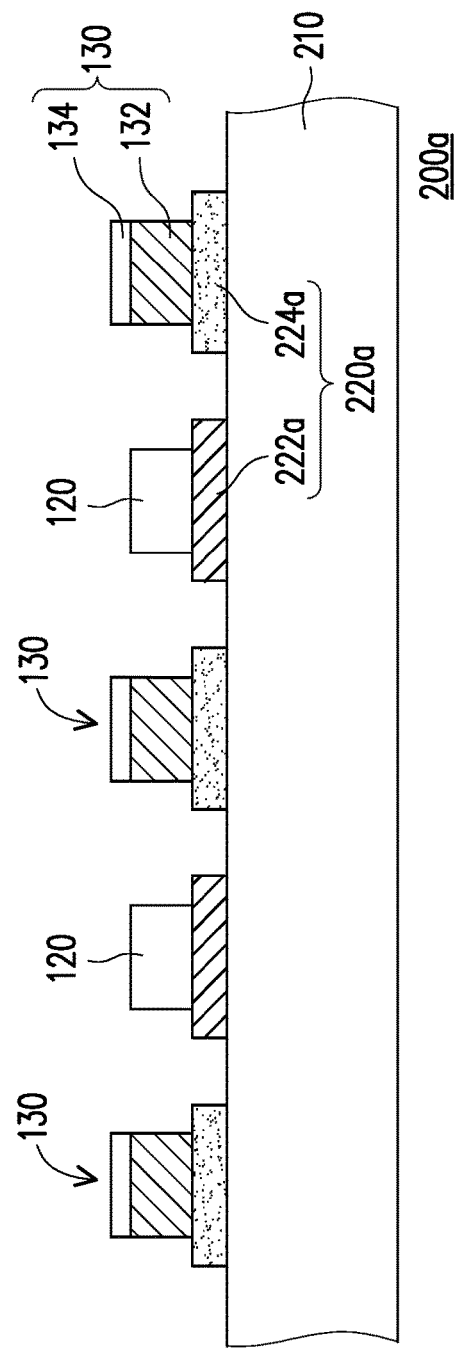

FIG. 3A is a schematic partial cross-sectional view of a micro light emitting diode device according to an embodiment of the disclosure. Referring to FIG. 3A, the micro light emitting diode device 200a of the present embodiment includes a circuit substrate 210, a plurality of micro light emitting elements 120, a plurality of light blocking structures 130, and a connection layer 220a. Herein, the micro light emitting elements 120 and the light blocking structures 130 are mass-transferred from the temporary substrate 110 (referring to FIG. 1G) onto the circuit substrate 210 by one time or two times of mass transfer. The circuit substrate 210 is, for example, a complementary metal-oxide-semiconductor (CMOS) substrate, a liquid crystal on silicon (LCOS) substrate, a thin film transistor (TFT) substrate, or other substrates with a working circuit, but the disclosure is not limited thereto. The micro light emitting elements 120 and the light blocking structures 130 are disposed on the circuit substrate 210, and the light blocking structures 130 and the micro light emitting elements 120 are arranged alternately with each other. The micro light emitting element 120 is electrically connected to the circuit substrate 210 through the connection layer 220a, and the light blocking structure 130 is fixed to the circuit substrate 210 through the connection layer 220a.

Furthermore, the connection layer 220a of the present embodiment includes a plurality of electrical pads 222a and a plurality of connection parts 224a. The electrical pads 222a are respectively located between the micro light emitting elements 120 and the circuit substrate 210, so as to electrically connect the micro light emitting elements 120 and the circuit substrate 210. The connection parts 224a are respectively located between the light blocking structures 130 and the circuit substrate 210, so as to connect and fix the light blocking structures 130 to the circuit substrate 210. Herein, the material of the electrical pad 222a is different from the material of the connection part 224a. The material of the electrical pad 222a is, for example, a conductive material such as metal or metal oxide, and the material of the connection part 224a is, for example, an organic material, but the disclosure is not limited thereto.

Herein, as shown in FIG. 3A, an orthographic projection area of each connection part 224a on the circuit substrate 210 is greater than an orthographic projection area of each light blocking structure 130 on the circuit substrate 210, so as to achieve good bonding reliability. Similarly, an orthographic projection area of each electrical pad 222a on the circuit substrate 210 is greater than an orthographic projection area of each micro light emitting element 120 on the circuit substrate 210, so that the micro light emitting element 120 has a larger bonding area to improve the bonding reliability. In addition, the Young's modulus of the light blocking layer 132 of the present embodiment is greater than the Young's modulus of the connection layer 220a, so as to provide good buffering capacity when bonding the light blocking layer 132 to the connection layer. The light absorption rate of the light shielding layer 134 is greater than the light absorption rate of the light blocking layer 132, and the reflectivity of the light blocking layer 132 is greater than the reflectivity of the light shielding layer 134 and the reflectivity of the connection layer 220a, so as to effectively reflect the lateral light of the micro light emitting elements 120 on two sides of the light blocking layer 132 to the front surface, and absorb the stray light above the micro light emitting elements 120 to prevent cross talk.

Figure 3B:
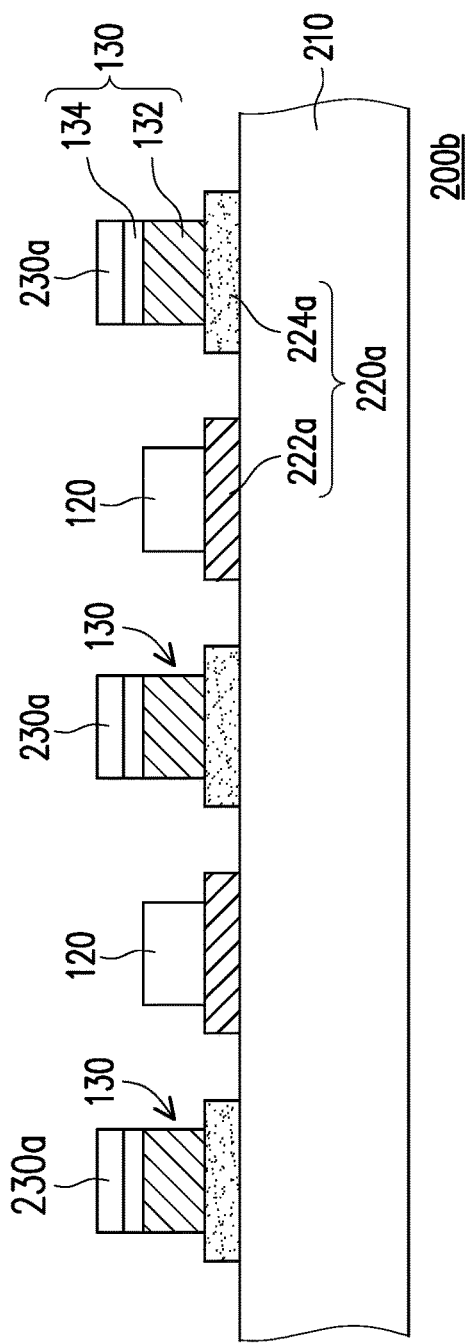

FIG. 3B is a schematic partial cross-sectional view of a micro light emitting diode device according to an embodiment of the disclosure. Referring to FIG. 3B and FIG. 3A, the micro light emitting diode device 200b of the present embodiment is similar to the micro light emitting diode device 200a of FIG. 3B, and the difference between the two devices is that: the micro light emitting diode device 200b of the present embodiment further includes a plurality of light guide layers 230a disposed on the light shielding layers 134. An edge of each light guide layer 230a is aligned with or smaller than an edge of the corresponding light shielding layer 134. Herein, the light guide layer 230a is the remaining part after the first fixing structure 142d of FIG. 2D is transferred to the circuit substrate 210, and may adjust the lateral light of the micro light emitting element 120 without blocking the light emitted by the micro light emitting element 120.

Figure 3C:
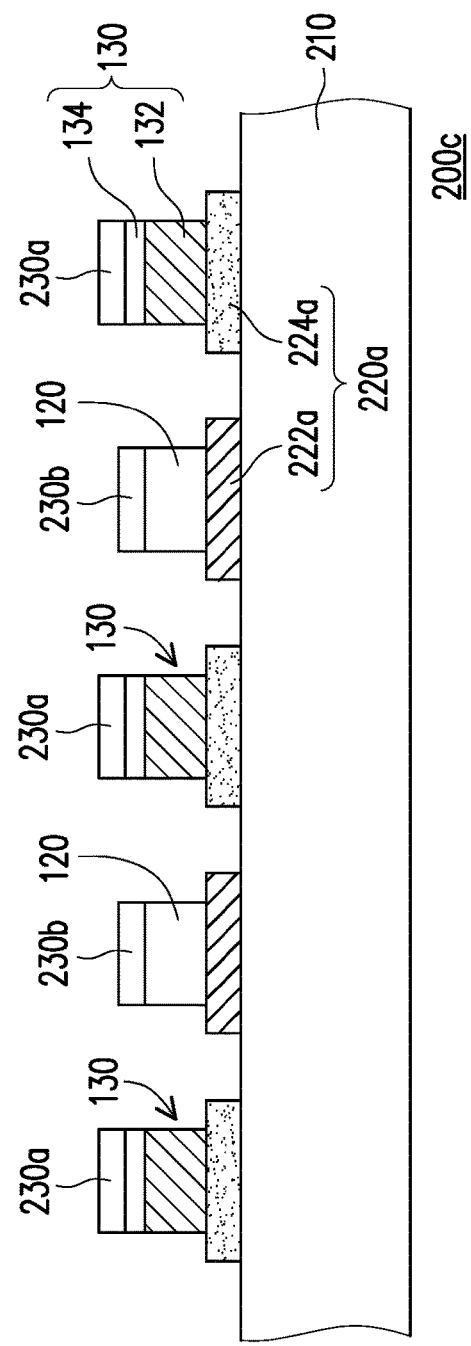

FIG. 3C is a schematic partial cross-sectional view of a micro light emitting diode device according to an embodiment of the disclosure. Referring to FIG. 3B and FIG. 3C, the micro light emitting diode device 200c of the present embodiment is similar to the micro light emitting diode device 200b of FIG. 3B, and the difference between the two devices is that: the micro light emitting diode device 200c of the present embodiment further includes a plurality of light guide layers 230b in addition to the light guide layers 230a. The light guide layer 230b is disposed on the micro light emitting element 120, and an edge of the light guide layer 230b is aligned with or smaller than an edge of the micro light emitting element 120. Herein, the light guide layer 230b is the remaining part after the second fixing structure 144d of FIG. 2D is transferred to the circuit substrate 210, and may be used to concentrate the forward light of the micro light emitting element 120.

FIG. 3D is a schematic partial cross-sectional view of a micro light emitting diode device according to an embodiment of the disclosure. Referring to FIG. 3A and FIG. 3D, the micro light emitting diode device 200d of the present embodiment is similar to the micro light emitting diode device 200a of FIG. 3A, and the difference between the two devices is that: the connection layer 220d of the present embodiment includes a plurality of pad parts 222d. The pad parts 222d are separated from each other and expose a part of the circuit substrate 210. The light blocking structure 130c further includes a plurality of light blocking connection layers 136. Each light blocking connection layer 136 connects each micro light emitting element 120 and the light blocking layers 132 on two opposite sides of the micro light emitting element 120. That is, the micro light emitting element 120 is located above the light blocking connection layer 136, and each pad part 222d is located between each light blocking connection layer 136 and the circuit substrate 210. Preferably, a circuit may be manufactured on the light blocking connection layer 136, such as a conductive through hole and a conductive via, so that the micro light emitting element 120 on the light blocking connection layer 136 may be electrically connected to the circuit substrate 210 through the pad part 222d below. When the light blocking layer 132 is a conductive structure, the vertical micro light emitting element 120 may also be directly electrically connected to the circuit substrate 210 through the light blocking layer 132 and the pad part 222d below, so as to increase the transfer bonding yield and alignment accuracy.

FIG. 3E is a schematic partial cross-sectional view of a micro light emitting diode device according to an embodiment of the disclosure. Referring to FIG. 3A and FIG. 3E, the micro light emitting diode device 200e of the present embodiment is similar to the micro light emitting diode device 200a of FIG. 3A, and the difference between the two devices is that: the connection layer of the present embodiment is embodied as an anisotropic conductive film layer 220e, which belongs to a low-temperature conductive adhesive layer. During transfer bonding, the micro light emitting element 120 is electrically connected to the circuit substrate 210 through the conductive particles in the anisotropic conductive film layer 220e, and the micro light emitting element 120 and the light blocking structure 130 are fixed to the circuit substrate 210 through the colloid in the anisotropic conductive film layer 220e, which increases the transfer bonding yield and alignment tolerance without an additional high-temperature and high-pressure bonding process and alignment accuracy.

Figure 3F:
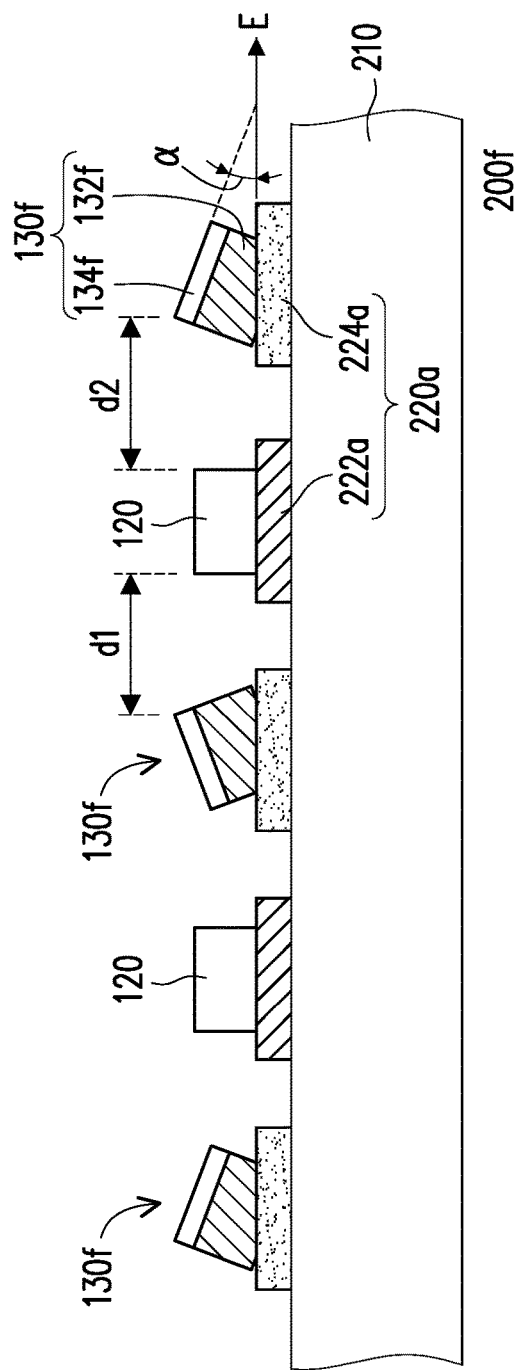

FIG. 3F is a schematic partial cross-sectional view of a micro light emitting diode device according to an embodiment of the disclosure. Referring to FIG. 3A and FIG. 3F, the micro light emitting diode device 200f of the present embodiment is similar to the micro light emitting diode device 200a of FIG. 3A, and the difference between the two devices is that: each light blocking structure 130f of the present embodiment is inclined at an angle α with respect to an extending direction E of the circuit substrate 210. In other words, in the present embodiment, the light blocking structure 130f including the light blocking layer 132f and the light shielding layer 134f has an inclination angle. The inclination angle is smaller than or equal to 90 degrees and greater than or equal to 45 degrees. The slight inclination and intersection reduce the streaks between pixels during display. Therefore, the light blocking structures 130f of the present embodiment may have different heights. In addition, the maximum distances d1 and d2 from the micro light emitting element 120 of the present embodiment to the light blocking structures 130f on two opposite sides (such as the left and right sides) are also different.

Figure 3G:
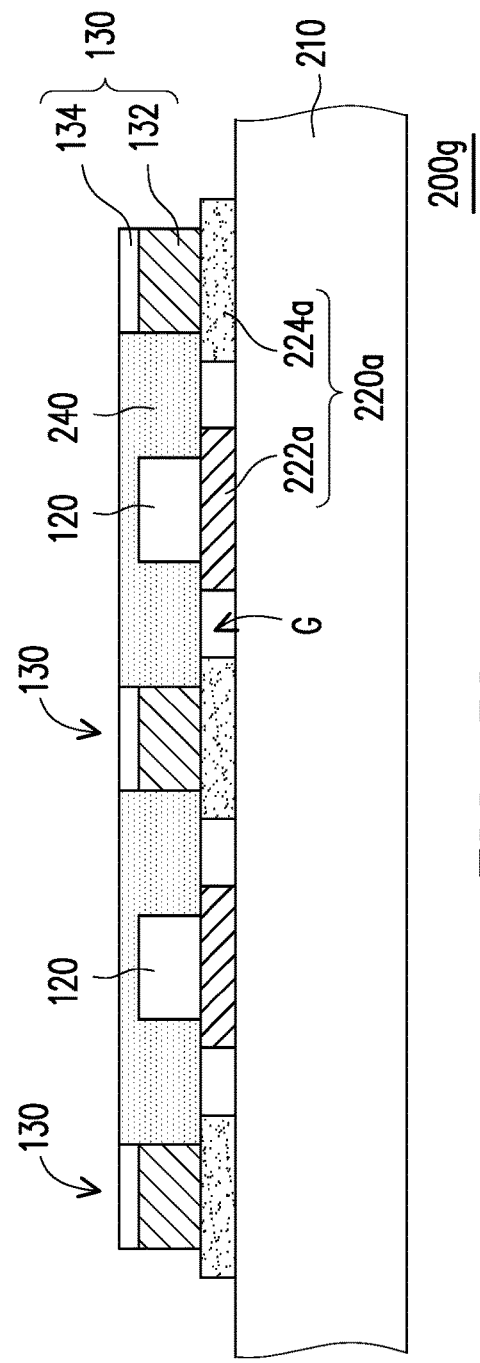

FIG. 3G is a schematic partial cross-sectional view of a micro light emitting diode device according to an embodiment of the disclosure. Referring to FIG. 3A and FIG. 3G, the micro light emitting diode device 200g of the present embodiment is similar to the micro light emitting diode device 200a of FIG. 3A, and the difference between the two devices is that: in the present embodiment, the micro light emitting diode device 200g further includes a light conversion layer 240. The light conversion layer 240 connects the light blocking structures 130 and covers the micro light emitting elements 120, so as to improve the light emitting efficiency of the micro light emitting elements 120 and serve as a connection during transfer to prevent displacement. Here, the light conversion layer 240 is aligned with the outer surface of the light shielding layer 134, but the disclosure is not limited thereto. In addition, a gap G is provided between the light conversion layer 240 and the circuit substrate 210. The gap G may be an air gap, for example, to increase the buffering capacity for overflow during bonding.

Figure 3H:
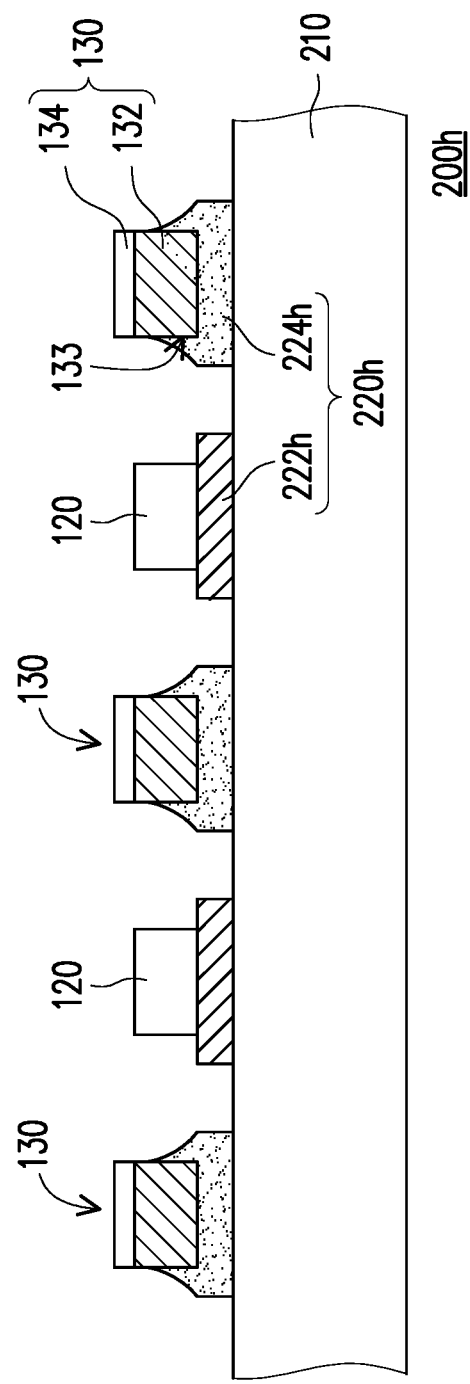

FIG. 3H is a schematic partial cross-sectional view of a micro light emitting diode device according to an embodiment of the disclosure. Referring to FIG. 3A and FIG. 3H, the micro light emitting diode device 200h of the present embodiment is similar to the micro light emitting diode device 200a of FIG. 3A, and the difference between the two devices is that: the connection layer 220h of the present embodiment includes a plurality of electrical pads 222h and a plurality of connection parts 224h. The electrical pads 222h are respectively located between the micro light emitting elements 120 and the circuit substrate 210, and the connection parts 224h are respectively located between the light blocking structures 130 and the circuit substrate 210. The connection part 224h extends to cover a peripheral surface 133 of the light blocking layer 132 of the light blocking structure 130, which increases the adhesion between the light blocking structure 130 and the circuit substrate 210.

In summary, in the manufacturing process of the micro light emitting diode structure of the disclosure, the fabricated light blocking structures and the micro light emitting elements are respectively transferred onto the temporary substrate, so as to obtain good process yield. As a result, the manufactured micro light emitting diode structure also has good structural reliability. In addition, with use of the micro light emitting diode structure of the disclosure, good display yield is achieved.

Although the disclosure has been described with reference to the above embodiments, the embodiments are not intended to limit the disclosure. A person of ordinary skill in the art may make variations and modifications without departing from the spirit and scope of the disclosure. Therefore, the protection scope of the disclosure is defined by the appended claims.

What is claimed is:
1. A micro light emitting diode structure, comprising:
a temporary substrate;
a plurality of micro light emitting elements disposed on the temporary substrate;
a plurality of light blocking structures disposed on the temporary substrate and arranged alternately with the micro light emitting elements, wherein each of the light blocking structures comprises a light blocking layer and a light shielding layer disposed on the light blocking layer; and
a connection layer, wherein the micro light emitting elements and the light blocking structures are fixed to the temporary substrate by the connection layer,
wherein the connection layer is a part of a plurality of fixing structures, a reflectivity of the light blocking layer is greater than a reflectivity of the connection layer, and a Young's modulus of the light blocking layer is greater than a Young's modulus of the fixing structures, and the Young's modulus of the fixing structures is greater than a Young's modulus of the light shielding layer.

2. The micro light emitting diode structure according to claim 1, wherein the reflectivity of the light blocking layer is greater than a reflectivity of the light shielding layer, and the Young's modulus of the light blocking layer is greater than a Young's modulus of the light shielding layer.

3. The micro light emitting diode structure according to claim 2, wherein the Young's modulus of the light shielding layer is greater than or equal to the Young's modulus of the connection layer.

4. The micro light emitting diode structure according to claim 1, wherein the fixing structures comprise a plurality of first fixing structures and a plurality of second fixing structures, each of the first fixing structures covers the light shielding layer and extends from an edge of the light shielding layer to cover an edge of the light blocking layer and is connected to the temporary substrate, a first air gap is provided between the light blocking layer and the temporary substrate, each of the second fixing structures covers the respective micro light emitting element and extends from an edge of the respective micro light emitting element and is connected to the temporary substrate, and a second air gap is provided between the respective micro light emitting element and the temporary substrate.

5. The micro light emitting diode structure according to claim 1, wherein an edge of the light shielding layer is aligned with an edge of the light blocking layer.

6. The micro light emitting diode structure according to claim 1, wherein a first height of each of the light blocking structures is greater than or equal to a second height of each of the micro light emitting elements.

7. The micro light emitting diode structure according to claim 6, wherein a third height of the light blocking layer is greater than or equal to the second height of each of the micro light emitting elements.

8. A micro light emitting diode device, comprising:
a circuit substrate;
a plurality of micro light emitting elements disposed on the circuit substrate;
a plurality of light blocking structures disposed on the circuit substrate and arranged alternately with the micro light emitting elements, wherein each of the light blocking structures comprises a light blocking layer and a light shielding layer disposed on the light blocking layer;
a connection layer, wherein the light blocking structures are fixed to the circuit substrate by the connection layer, wherein a reflectivity of the light blocking layer is greater than a reflectivity of the connection layer, and a Young's modulus of the light blocking layer is greater than a Young's modulus of the connection layer,
wherein the reflectivity of the light blocking layer is greater than a reflectivity of the light shielding layer, and the Young's modulus of the light blocking layer is greater than a Young's modulus of the light shielding layer; and
a plurality of light guide layers at least disposed on the light shielding layer, wherein an edge of each of the light guide layers is aligned with or smaller than an edge of the corresponding light shielding layer.

9. The micro light emitting diode device according to claim 8, wherein the connection layer comprises a plurality of connection parts, the connection parts are respectively located between the light blocking structures and the circuit substrate, and the Young's modulus of the light blocking layer is greater than a Young's modulus of the connection part.

10. The micro light emitting diode device according to claim 9, wherein an orthographic projection area of each of the connection parts on the circuit substrate is greater than an orthographic projection area of each of the light blocking structures on the circuit substrate.

11. The micro light emitting diode device according to claim 8, wherein the connection layer comprises a plurality of pad parts, the light blocking structures further comprise a plurality of light blocking connection layers, each of the light blocking connection layers connects each of the micro light emitting elements and the light blocking layers located on two opposite sides of each of the micro light emitting elements, each of the pad parts is located between the light blocking connection layer and the circuit substrate, and the micro light emitting elements are electrically connected to the circuit substrate through the pad parts.

12. The micro light emitting diode device according to claim 8, wherein the connection layer is an anisotropic conductive film layer.

13. The micro light emitting diode device according to claim 8, wherein each of the light blocking structures is inclined at an angle with respect to an extending direction of the circuit substrate, and maximum distances from each of the micro light emitting elements to the light blocking structures located on two opposite sides are different.

14. The micro light emitting diode device according to claim 8, further comprising:
a light conversion layer connecting the light blocking structures and covering the micro light emitting elements, wherein a gap is provided between the light conversion layer and the circuit substrate.

* * * * *